(12) United States Patent
Sawada et al.

(10) Patent No.: US 7,847,186 B2
(45) Date of Patent: Dec. 7, 2010

(54) SILICON BASED THIN FILM SOLAR CELL

(75) Inventors: Toru Sawada, Uji (JP); Yohei Koi, Ohtsu (JP); Toshiaki Sasaki, Ohtsu (JP); Masashi Yoshimi, Kobe (JP); Masahiro Goto, Otsu (JP); Kenji Yamamoto, Kobe (JP)

(73) Assignee: Kaneka Corporation, Osaka-shi (JP)

( * ) Notice: Subject to any disclaimer, the term of this patent is extended or adjusted under 35 U.S.C. 154(b) by 509 days.

(21) Appl. No.: 10/563,009

(22) PCT Filed: Jul. 12, 2004

(86) PCT No.: PCT/JP2004/010248

§ 371 (c)(1),
(2), (4) Date: Dec. 28, 2005

(87) PCT Pub. No.: WO2005/011002

PCT Pub. Date: Feb. 3, 2005

(65) Prior Publication Data

US 2006/0174935 A1    Aug. 10, 2006

(30) Foreign Application Priority Data

Jul. 24, 2003  (JP) ............................. 2003-279491
Oct. 17, 2003  (JP) ............................. 2003-358362

(51) Int. Cl.
*H01L 31/00* (2006.01)

(52) U.S. Cl. ........................................ 136/252

(58) Field of Classification Search .................. None
See application file for complete search history.

(56) References Cited

U.S. PATENT DOCUMENTS 4,718,947 A * 1/1988 Arya .......................... 136/258
4,776,894 A * 10/1988 Watanabe et al. .......... 136/249
4,781,765 A * 11/1988 Watanabe et al. .......... 136/249
4,926,230 A * 5/1990 Yamagishi et al. ......... 136/249
5,055,141 A * 10/1991 Arya et al. .................. 136/258
5,419,783 A * 5/1995 Noguchi et al. ............ 438/93
6,384,319 B1 5/2002 Sasaki et al.

FOREIGN PATENT DOCUMENTS

JP     59035016 A * 2/1984 ................. 136/243

(Continued)

OTHER PUBLICATIONS

Chinese language office action and its English language translation for corresponding Chinese application 2004800210593 lists the reference above.

(Continued)

*Primary Examiner*—Alexa D Neckel
*Assistant Examiner*—Miriam Berdichevsky
(74) *Attorney, Agent, or Firm*—Alleman Hall McCoy Russell & Tuttle LLP

(57) ABSTRACT

According to the present invention, sufficient light trapping effect can be exhibited and series resistance can be kept small, by sequentially forming a silicon based low refractive index layer and a thin silicon based interface layer on a backside of a photoelectric conversion layer observed from a light incident side, and as a result a silicon based thin film solar cell may be provided efficiently and at low cost.

4 Claims, 7 Drawing Sheets

FOREIGN PATENT DOCUMENTS

| | | |
|---|---|---|
| JP | 62-234379 | 10/1987 |
| JP | 63-120476 | 5/1988 |
| JP | 06-267868 | 9/1994 |
| JP | 11186574 A | 7/1999 |
| JP | 2000-138384 | 5/2000 |
| JP | 2000-269528 | 9/2000 |
| JP | 2001-203374 | 7/2001 |
| JP | 2003-258297 | 9/2003 |

OTHER PUBLICATIONS

European search report for corresponding European application 04747712.0 lists the reference above.

* cited by examiner 0.5 μm

SILICON BASED THIN FILM SOLAR CELL

This application is a national phase of PCT application PCT/JP2004/010248 filed on Jul. 12, 2004, claiming priority to Japanese Application Nos. 2003-279491 filed on Jul. 24, 2003 and 2003-358362 filed Oct. 17, 2003, the entirety of which are incorporated by reference.

TECHNICAL FIELD

The present invention relates to a silicon based thin film solar cell, and in particular to a thin film solar cell enabling demonstration of light trapping effect by disposing a layer having a smaller refractive index than a refractive index of the photoelectric conversion layer on a backside of a photoelectric conversion layer observed from a light incident side.

BACKGROUND ART

In recent years, various thin film solar cells have come into use, in addition to conventional amorphous thin film solar cells, crystalline thin film solar cells are also being developed, and moreover hybrid thin film solar cells obtained by laminating these solar cells together are also put in practical use.

Thin film solar cells in general comprise a first electrode, one or more semiconductor thin film photoelectric conversion units, and a second electrode laminated in an order on a substrate. And one photoelectric conversion unit comprises an i type layer sandwiched by a p type layer and an n type layer.

The i type layer is substantially an intrinsic semiconductor layer, occupies a large percentage of a thickness of the photoelectric conversion unit, and then photoelectric conversion effect is generated mainly within this i type layer. For this reason, this i type layer is usually referred to as an i type photoelectric conversion layer, or simply as a photoelectric conversion layer. The photoelectric conversion layer is not limited to an intrinsic semiconductor layer, but may be a layer obtained by being doped, within a range in which loss of light absorbed with doped impurity does not cause problems, into a p type or an n type in a very small quantity range. Although a thicker photoelectric conversion layer is more preferable for light absorption, a layer thicker than necessary may cause results of increasing cost for film-forming and time for production.

On the other hand, conductivity type layers of a p type or an n type exhibit function to generate a diffusion potential in a photoelectric conversion unit, a magnitude of this diffusion potential influences a value of an open circuit voltage as one of important characteristics of a thin film solar cell. However, these conductivity type layers are inert layers not directly contributing to photoelectric conversion, and thus light absorbed with impurity doped in the conductivity type layer gives loss not contributing to generation of electric power. Therefore, the conductivity type layers of the p type and the n type are preferably maintained for a smallest possible thickness within a range for generation of a sufficient diffusion potential.

Here, in the above-mentioned a pin (nip) type photoelectric conversion unit or a thin film solar cell, when a photoelectric conversion layer occupying a principal portion is amorphous, it is called an amorphous unit or an amorphous thin film solar cell, and when a photoelectric conversion layer is crystalline, it is called a crystalline unit or a crystalline thin film solar cell, regardless of whether conductivity type layers of p type and n type included therein are amorphous or crystalline.

As a method of improving conversion efficiency of a thin film solar cell, a method of laminating two or more photoelectric conversion units to obtain a tandem unit may be mentioned. In this method, a front unit comprising a photoelectric conversion layer having a larger band gap is disposed on a light incident side of a thin film solar cell, and a back unit comprising a photoelectric conversion layer having a smaller band gap is disposed in an order on a back side of the front unit, and this configuration thereby enables photoelectric conversion over a large wave range of an incident light, and realizes improvement in conversion efficiency as a whole solar cell. Among such tandem solar cells, especially a solar cell having an amorphous photoelectric conversion unit and a crystalline photoelectric conversion unit laminated together is referred to as a hybrid thin film solar cell.

For example, in a longer wavelength side, an i type amorphous silicone exhibits photoelectric conversion function in wavelength of a light up to about 800 nm, while an i type crystalline silicone can exhibit photoelectric conversion function with a light of longer wavelength of about 1100 nm. However, although a light absorption even with a sufficient thickness of about not more than 0.3 micrometers can be realized in an amorphous silicone photoelectric conversion layer having a larger light absorption coefficient, in a crystalline silicone photoelectric conversion layer having a smaller light absorption coefficient, in order to fully absorb light of a longer wavelength, the layer preferably has a thickness of about 1.5 to 3 micrometers. That is, usually a crystalline photoelectric conversion layer preferably has a thickness of about 5 to 10 times as large as a thickness of an amorphous photoelectric conversion layer.

In a monolayer amorphous silicon thin film solar cell, and also in the above-mentioned hybrid thin film solar cell, a thickness of a photoelectric conversion layer is desirably maintained as small as possible, from a viewpoint of improvement in productivity, that is, cost reduction. For this reason, generally used is a structure using what is called light trapping effect in which a disposition of a layer having a refractive index smaller than a refractive index of a photoelectric conversion layer, on a backside of the photoelectric conversion layer observed from a light incident side enables effective reflection of light of a particular wavelength. A disposition on a backside of a photoelectric conversion layer observed from a light incident side means a disposition contacting to the photoelectric conversion layer on a side of a back face, or a disposition on a side of a back face in a state of sandwiching an other layer disposed on a back face of the photoelectric conversion layer.

Japanese Patent Laid-Open No. 02-73672 official report discloses a structure of a solar cell in which a translucent first electrode, an amorphous silicon semiconductor thin film (hereinafter referred to as simply semiconductor thin film), a zinc oxide film having a thickness of less than 1200 angstroms, a non-translucent second electrode (metal electrode) are laminated in this order from a light incident side. The zinc oxide film has a function for preventing a silicide formed in an interface between the semiconductor thin film and the metal electrode increase absorption loss. Since refractive index difference exists between the zinc oxide film and the semiconductor thin film, a thickness of the zinc oxide film limited to a range of less than 1200 angstroms and preferably to a range of 300 angstroms to 900 angstroms has an effect of improving reflectance in an interface of the semiconductor thin film/the zinc oxide film. For this reason, a short-circuit current density of the solar cell and consequently a conversion efficiency improves. However, since the zinc oxide film is formed by a technique of sputtering, spraying, etc., different facilities from that for semiconductor thin film formed in general by plasma CVD methods etc. are required, leading to occurrence of problems of facility cost rise and longer production tact. Furthermore, there may occur problems that especially use of sputtering method in formation of the zinc oxide film may cause performance reduction by sputter damage to a ground semiconductor thin film. According to examples, the above-mentioned semiconductor thin film consists of a P type a-SiC:H film, a non doped a-Si:H film, and an n type a-Si:H film. In this case in order to generate sufficient diffusion potential in a non doped a-Si:H film, a thickness of an n type a-Si:H film requires 150 angstroms to 300 angstroms in general, which will not permit ignoring absorption loss of light passing through the n type a-Si:H film.

Japanese Patent Laid-Open No. 4-167473 official report discloses a structure, in a sequential order from light incident side, of a transparent electrode/one electric conductive type amorphous semiconductor layer/an intrinsic amorphous semiconductor layer/an amorphous silicon oxynitride or amorphous silicon oxide (hereinafter referred as a-SiON or a-SiO)/a metal oxide layer/a high reflective metal layer/a substrate. However, this a-SiON (a-SiO) layer is formed for prevention of increase in absorption loss by reduction of the metal oxide layer that may be obtained when forming the amorphous semiconductor layer on the metal oxide layer, and no description is disclosed that light trapping may be performed using refractive index difference between the a-SiON (a-SiO) layer and the intrinsic amorphous semiconductor layer. Specifically, in Examples, a thickness of a-SiON (a-SiO) layer set thin as 200 angstroms does not permit expectation of sufficient light trapping effect.

Japanese Patent Laid-Open No. 6-267868 official report discloses a method for forming a film of a-SiO including microcrystalline phase of silicon characterized by being based on decomposition of a source gas having not more than 0.6 of a value of $CO_2/(SiH_4+CO_2)$. The official report describes that this film represents a high photoconductivity not less than $10^{-6}$ S/cm, and a low absorption coefficient, and is suitable for a window layer of amorphous silicon based solar cells. However, this official report fails to describe about a refractive index of the obtained film, and fails to describe that the film can be disposed on a backside of a photoelectric conversion layer of the solar cell observed from a light incident side. The present inventors carried out investigation for application of a silicon oxide layer by a high frequency plasma CVD method for an n type layer of pin type silicon based thin film solar cell using $SiH_4$, $CO_2$, $H_2$, and $PH_3$ as reactive gas, based on teachings obtained by the documentary materials. As a result, it was found our that using a technique of disposing a silicon oxide layer on a backside of a photoelectric conversion layer, and of setting a ratio of $CO_2/SiH_4$ larger, light trapping effect was exhibited and a short-circuit current of the solar cell was increased when increasing an amount of oxygen in the layer and a difference of refractive index with the photoelectric conversion layer. However, only simple use of the silicon oxide as an n type layer increased a series resistance of the solar cell, leading to a problem of reduction of conversion efficiency. This is considered to originate in a contact resistance between silicon oxide and a metal oxide layers, such as ZnO as a part of a back electrode.

Thus, conventional technique cannot solve a problem of series resistance of solar cells that is believed to be caused by a contact resistance generated between a silicon based low-refractive index layer represented by silicon oxides, and a back electrode.

DISCLOSURE OF INVENTION

Taking the above situations into consideration, by disposing a layer having a lower refractive index compared with that of a photoelectric conversion layer, on a backside of the photoelectric conversion layer observed from a light incident side, without using different facilities from those for formation of the photoelectric conversion layer, the present invention aims at providing a silicon based thin film solar cell, efficiently and at a low cost, that can exhibit sufficient light trapping effect and can keep a series resistance of the solar cell smaller even if a layer having a low refractive index is disposed.

A silicon based thin film solar cell by the present invention is characterized in that a silicon based low refractive index layer and a silicon based interface layer are disposed in this order on a backside of a photoelectric conversion layer observed from a light incident side.

The silicon based low refractive index layer has a function to generate a diffusion potential in the photoelectric conversion layer, which is a layer doped with impurity to give a p type or an n type. In order to effectively reflect light on a surface thereof to the photoelectric conversion layer side, and to keep absorption loss of light in the layer as small as possible, the silicon based low refractive index layer preferably has a refractive index of not more than 2.5 at a wavelength of 600 nm, and has a thickness of not less than 300 angstroms.

A silicon based low refractive index layer is an alloy layer comprising silicon and elements, such as oxygen, typically a silicon oxides, preferably a ratio of a most abundantly existing constituent element, excluding silicon, in the layer is not less than 25 atom %, and the layer is preferably formed by methods, such as a high frequency plasma CVD that are same kind as methods for a photoelectric conversion layer. The silicon based low refractive index layer preferably includes crystalline silicon components in the layer, in order to reduce a resistance in a thickness direction of the layer itself.

A silicon based interface layer is a conductivity type layer having silicon as a principal component. Since the silicon based interface layer does not need to contribute to generation of a diffusion potential in the photoelectric conversion layer, it preferably has a thickness of not more than 150 angstroms, and more preferably has a thickness of not more than 100 angstroms in order to keep light absorption loss in the layer as small as possible. Furthermore, in order to keep a contact resistance with back electrode small, it preferably comprises a crystalline silicon component in the layer.

In order to solve problems of increase in a series resistance of a solar cell caused by disposition of a silicon based low refractive index layer in a backside of a photoelectric conversion layer, the present inventors wholeheartedly investigated structures for optimal solar cells. As a result, it was found out that by disposing a thin silicon based interface layer in a backside of a silicon based low refractive index layer, a contact resistance to a back electrode layer comprising metal oxide layer disposed in a backside thereof was improved, and thereby a series resistance of the solar cell became smaller and conversion efficiency was improved.

In the present invention, a silicon based interface layer disposed between a silicon based low refractive index layer and a back electrode layer has small contact resistances with either of the silicon based low refractive index layer and the back electrode layer, and as a result a small series resistance of the solar cell is believed to be realized. Especially, as shown in FIG. 1, when silicon oxide is used as a silicon based low refractive index layer, and an amount of oxygen in the layer is increased to lower a refractive index to not more than 2.5, it is difficult to lower a contact resistance between the silicon based low refractive index layer and the back electrode layer. However, such a problem is solved by inserting a silicon based interface layer. Therefore, this technique enables design of the silicon based low refractive index layer to an optimal thickness and an optimal refractive index for light trapping. Furthermore, since simple change of film-forming conditions permits adjustment of a refractive index of the silicon based low refractive index layer, increase in light trapping effect by more delicate optical designs can also be expected, such as periodic variation of a refractive index in a thickness direction.

Herein a description will be given about a silicon based thin film solar cell as an embodiment of the invention referring to FIG. 2.

A transparent electrode layer 2 is formed on a translucent board 1. As the translucent board 1, a tabular member and a sheet shaped member comprising a glass, a transparent resin, etc. are used. The transparent electrode layer 2 preferably comprises conductive metal oxides, such as $SnO_2$ and ZnO, and preferably formed using methods, such as CVD, sputtering, and vapor deposition. The transparent electrode layer 2 preferably has minute unevenness formed on a surface thereof, and preferably has an effect of increasing dispersion of incident light. An amorphous photoelectric conversion unit 3 is formed on the transparent electrode layer 2. The amorphous photoelectric conversion unit 3 comprises an amorphous p type silicon carbide layer 3p, non doped amorphous i type silicon photoelectric conversion layer 3i, and an n type silicon based interface layers 3n. A crystalline photoelectric conversion unit 4 is formed on the amorphous photoelectric conversion unit 3. A high frequency plasma CVD method is suitable for formation of the amorphous photoelectric conversion unit 3 and the crystalline photoelectric conversion unit 4 (both of the units are simply, hereinafter, collectively referred to as photoelectric conversion unit). As formation conditions for the photoelectric conversion unit, preferably used are conditions of: substrate temperature 100 to 300 degrees C.; pressure 30 to 1500 Pa; and high frequency power density 0.01 to 0.5 W/cm². As a source gas used for photoelectric conversion unit formation, silicon including gases, such as $SiH_4$ and $Si_2H_6$ etc. or a mixed gas thereof with $H_2$ are used. As dopant gas for forming a p type or an n type layer in the photoelectric conversion unit, $B_2H_6$ or $PH_3$ etc. is preferably used.

The crystalline photoelectric conversion unit 4 comprises a crystalline p type silicon layer 4p; a crystalline i type silicon photoelectric conversion layer 4i; an n type silicon based low refractive index layer 4on; and an n type silicon based interface layer 4n. As a n type silicon based low refractive index layer 4on, silicon oxide is typically used, and in the case a mixed gas of $SiH_4$, $H_2$, $CO_2$, and $PH_3$ is suitable for a source gas to be used. The silicon based low refractive index layer 4on may or may not comprise crystalline silicon components. A refractive index at a wavelength of 600 nm of the silicon based low refractive index layer 4on is preferably not more than 2.5. A percentage of a most abundantly existing constituent element except silicon in a layer in the silicon based low refractive index layer 4on is preferably not less than 25 atomic %. A thickness of the silicon based low refractive index layer 4on is preferably not less than 300 angstroms, and more preferably 500 angstroms to 900 angstroms. When silicon oxide is used as the silicon based low refractive index layer 4on, in order to realize a percentage of oxygen occupied in the layer, or a refractive index thereof, a gas ratio of $CO_2/SiH_4$ is approximately 2 to 10. The silicon based low refractive index layer 4on may have a fixed refractive index in a thickness direction, or may have refractive indexes varying in a thickness direction. Furthermore, it may have refractive indexes periodically variable. FIG. 2 shows a structure that the n type silicon based low refractive index layer 4on is disposed, contacting the crystalline i type silicon photoelectric conversion layer 4i, on a backside of the crystalline i type silicon photoelectric conversion layer 4i observed from a light incident side. Other layers, such as an n type silicon layer, may be disposed in a state sandwiched between the crystalline i type silicon photoelectric conversion layer 4i and the n type silicon based low refractive index layer 4on. And the silicon based low refractive index layer 4on may be a layer, instead of silicon oxide, including any one or more elements of nitrogen, carbon, and oxygen in addition to silicon, such as silicon nitride, silicon carbide, silicon oxy-nitride, silicon oxy-carbide, etc.

An n type silicon based interface layer 4n is formed on the n type silicon based low refractive index layer 4on. Crystalline silicon is mainly used for the n type silicon based interface layer 4n. The n type silicon based interface layer 4n is used in order to improve a contact resistance between the n type silicon based low refractive index layer 4on and a back electrode 5, and thus preferably has a thickness as small as possible in order to minimize light absorption loss in this layer. Specifically, the thickness is not more than 150 angstroms, and more preferably not more than 100 angstroms. Furthermore, as the n type silicon based interface layer 4n, a layer having an electric conductivity of about 1 to $10^2$ S/cm is used. The n type silicon based interface layer 4n may include any one or more elements of oxygen, carbon, and nitrogen in a range not increasing a contact resistance with the back electrode 5.

The back electrode 5 is formed on the n type silicon based interface layer 4n. The back electrode 5 consists of a transparent reflecting layer 5t, and a back reflecting layer 5m. Metal oxides, such as ZnO and ITO, are preferably used for the transparent reflecting layer 5t, and Ag, Al, or alloys thereof are preferably used for the back reflecting layer 5m. In formation of the back electrode 5, methods such as sputtering and vapor deposition, are preferably used. Although FIG. 2 indicates a structure of a hybrid thin film solar cell, a number of the photoelectric conversion units 4 needs not necessarily to be two, and it may be amorphous or crystalline and may have a solar cell structure with monolayer or three or more layer-type. Furthermore FIG. 2 shows a structure in which a photoelectric conversion layer, a silicon based low refractive index layer, and an n type silicon based interface layer are disposed on a translucent board in this order, or it may have what is called a reverse type structure in which an n type silicon based interface layer, a silicon based low refractive index layer, and a photoelectric conversion layer are deposited in this order on a conductive boards of such as metal, or an insulated substrate. The present invention corresponds to a patent application concerning achievement of sponsored research by the government. (Japanese, New Energy and Industrial Technology Development Organization in Heisei 15 fiscal year "Photovoltaic power generation technical research development commission enterprise", Article 30 of

BEST MODE FOR CARRYING OUT THE INVENTION

Descriptions will, hereinafter, be given for Examples 1, 2, and 3 as a silicon based thin film solar cell by the present invention, comparing with Comparative Examples 1 and 2 with reference to FIG. 3.

Example 1

Figure 3:
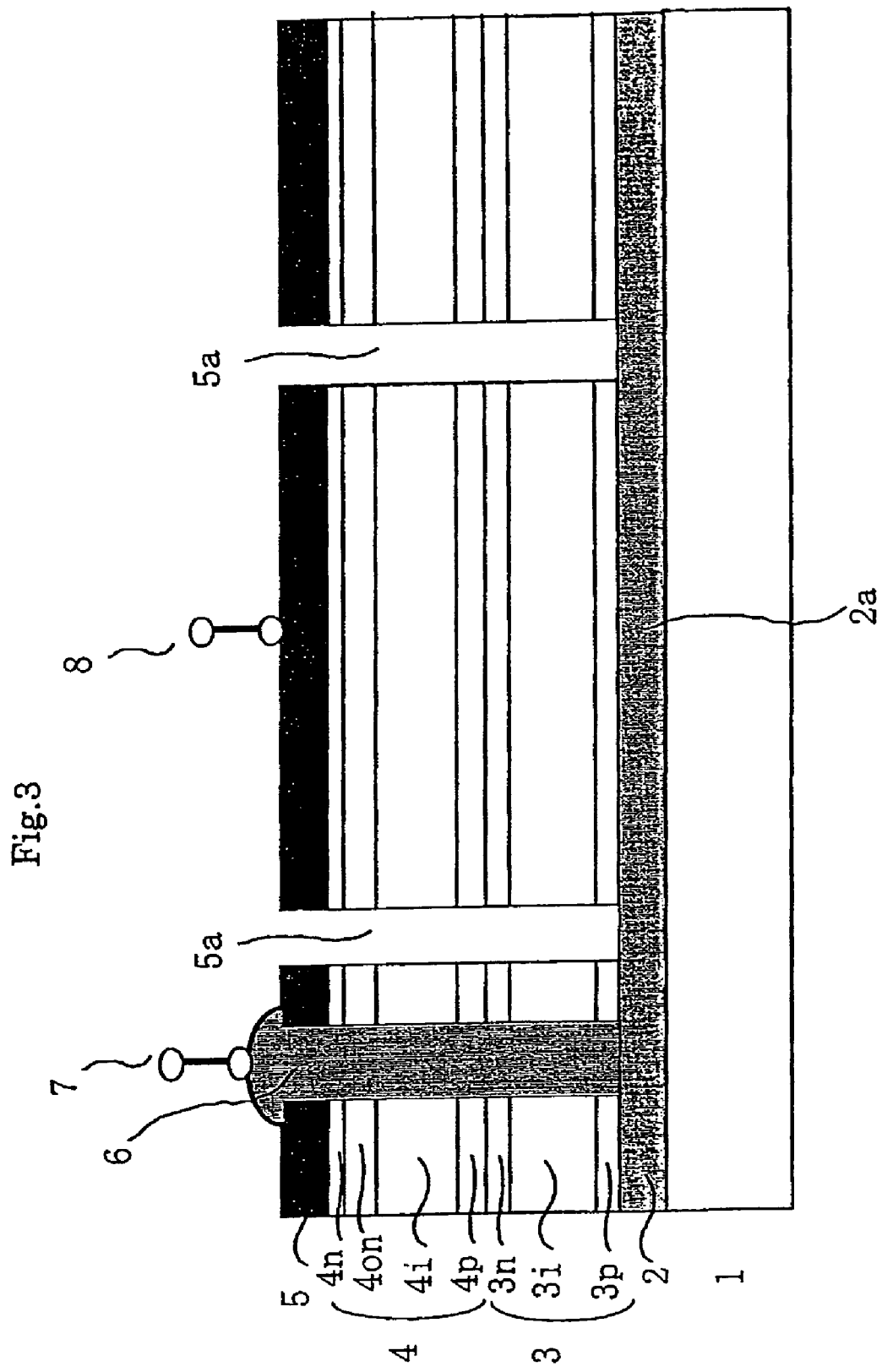
FIG. 3 is a schematic sectional view of hybrid thin film solar cells produced in each Example and Comparative Example.

FIG. 3 is a sectional view showing schematically a hybrid thin film solar cell produced in each Example and each Comparative Example.

First, a transparent electrode layer 2 consisting of $SnO_2$ and having a minute uneven structure on a surface thereof was formed by a heat CVD method on a principal surface of a translucent board 1 consisting a blue plate glass of a thickness of 0.7 mm.

Next, in order to form an amorphous photoelectric conversion unit 3, the translucent board 1 having a transparent electrode layer 2 formed thereon was introduced in a high frequency plasma CVD device. After the equipment was heated up to a predetermined temperature, an amorphous p type silicon carbide layer 3p with a thickness of 160 angstroms, a non doped amorphous i type silicon photoelectric conversion layer 3i with a thickness of 3000 angstroms, and an n type silicon layer 3n with a thickness of 300 angstroms were sequentially laminated.

Furthermore, in order to form a crystalline photoelectric conversion unit 4, using a plasma CVD device, a p type crystalline silicon layer 4p with a thickness of 150 angstroms, a crystalline i type silicon photoelectric conversion layer 4i with a thickness of 1.4 micrometers, an n type silicon based low refractive index layer 4on with a thickness of 600 angstroms, and an n type crystalline silicon based interface layer 4n with a thickness of 50 angstroms to 70 angstroms were sequentially laminated. Film-forming conditions of the n type silicon based low refractive index layer 4on in the case are shown below: a distance between substrate film-forming side-electrode of 10 to 15 mm; a pressure of 350 to 1300 Pa; a high frequency power density of 0.1 to 0.13 W/cm$^2$; and flow rates of $SiH_4/CO_2/PH_3/H_2$ of 15/120/0.5/9000 sccm, respectively. A refractive index of an n type silicon based low refractive index layer deposited by a thickness of 2500 angstroms on a glass using identical film-forming conditions was measured for by spectrum ellipsometry to give 1.9 at a wavelength of 600 nm. On the other hand, film-forming conditions of the n type silicon based interface layer 4n are shown below: a distance between substrate film-forming side-electrode of 10 to 15 mm; a pressure of 350 to 1300 Pa; a high frequency power density of 0.11 W/cm$^2$; and flow rates of $SiH_4/PH_3/H_2$ of 20/0.5/2500 sccm respectively. An electric conductivity of an n type silicon based interface layer deposited with a thickness of 2500 angstroms on a glass on identical film-forming conditions gave 12 S/cm.

Then, as back electrodes 5, a transparent reflecting layer consisting of ZnO with a thickness of 300 angstroms (not shown) and a back reflecting layer consisting of Ag with a thickness of 2000 angstroms (not shown) were formed using a DC sputtering method.

Furthermore, in order to isolate the amorphous photoelectric conversion unit 3, the crystalline photoelectric conversion unit 4, and the back electrode 5 in a shape of an island, while leaving the transparent electrode layer 2, two or more of back electrode layer isolation grooves 5a were formed by irradiating a YAG second harmonics pulsed laser to the translucent board 1. Although not shown, two or more back electrode isolation grooves perpendicularly intersecting to the back electrode layer isolation groove 5a were also formed to give island-like isolated areas. Furthermore, on outside of the island-like isolated area adjacent to the back electrode layer isolation groove 5a a back electrode layer isolation groove was further formed, and then solder was permeated to an inside thereof to form a contact area 6 with respect to the transparent electrode layer 2. Thus, a hybrid thin film solar cell was produced. This hybrid thin film solar cell has an effective area of 1 cm$^2$. In Example 1, totally 25 of the solar cells were produced on one substrate.

Pseudo-solar light having a spectrum distribution AM 1.5 and an energy density 100 mW/cm$^2$ was irradiated to the hybrid thin film solar cell produced in Example 1 under a condition of temperature of measurement atmosphere and solar cell as 25±1 degrees C. A voltage and an electric current between a positive electrode probe 7 in contact with the transparent electrode layer 2 through the contact area 6, and a negative electrode probe 8 in contact with the back electrode 5 were measured to obtain an output characteristic of the thin film solar cell. Table 1 shows an average performance of 25 hybrid thin film solar cells produced in Example 1.

Figure 4:
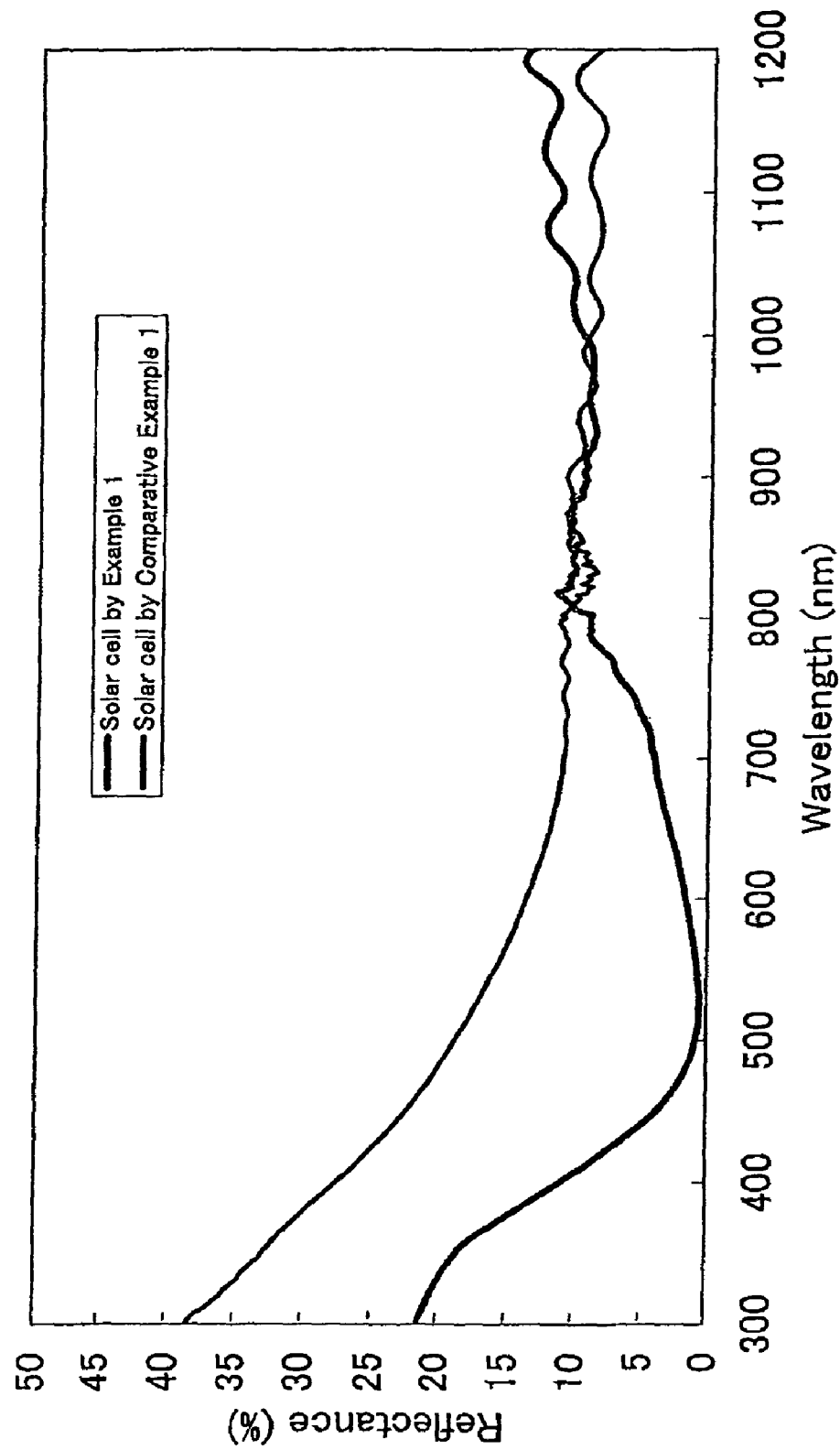
FIG. 4 is a figure showing a reflection spectrum in which light was entered and was measured from a surface exposed by etching removal of a back electrode of solar cells produced by Example 1 and Comparative Example 1.

A part of the solar cell was dipped in a nitric acid aqueous solution, and etching removal of the back electrode 5 was carried out to expose the n type silicon based interface layer 4n. In this state, light was irradiated from a side of the n type silicon based interface layer 4n, and a reflection spectrum was measured for. FIG. 4 shows the reflection spectrum. Next, then type silicon based interface layer 4n was removed by a reactive ion etching (RIE) method to expose the n type silicon based low refractive index layer 4on. A refractive index of this silicon based low refractive index layer measured by a spectrum ellipsometry gave 1.93 at a wavelength of 600 nm. Moreover, an amount of oxygen in the silicon based low refractive index layer measured by an X-ray photoelectron spectroscopy (XPS) gave 48 atomic %.

Example 2

Figure 5:
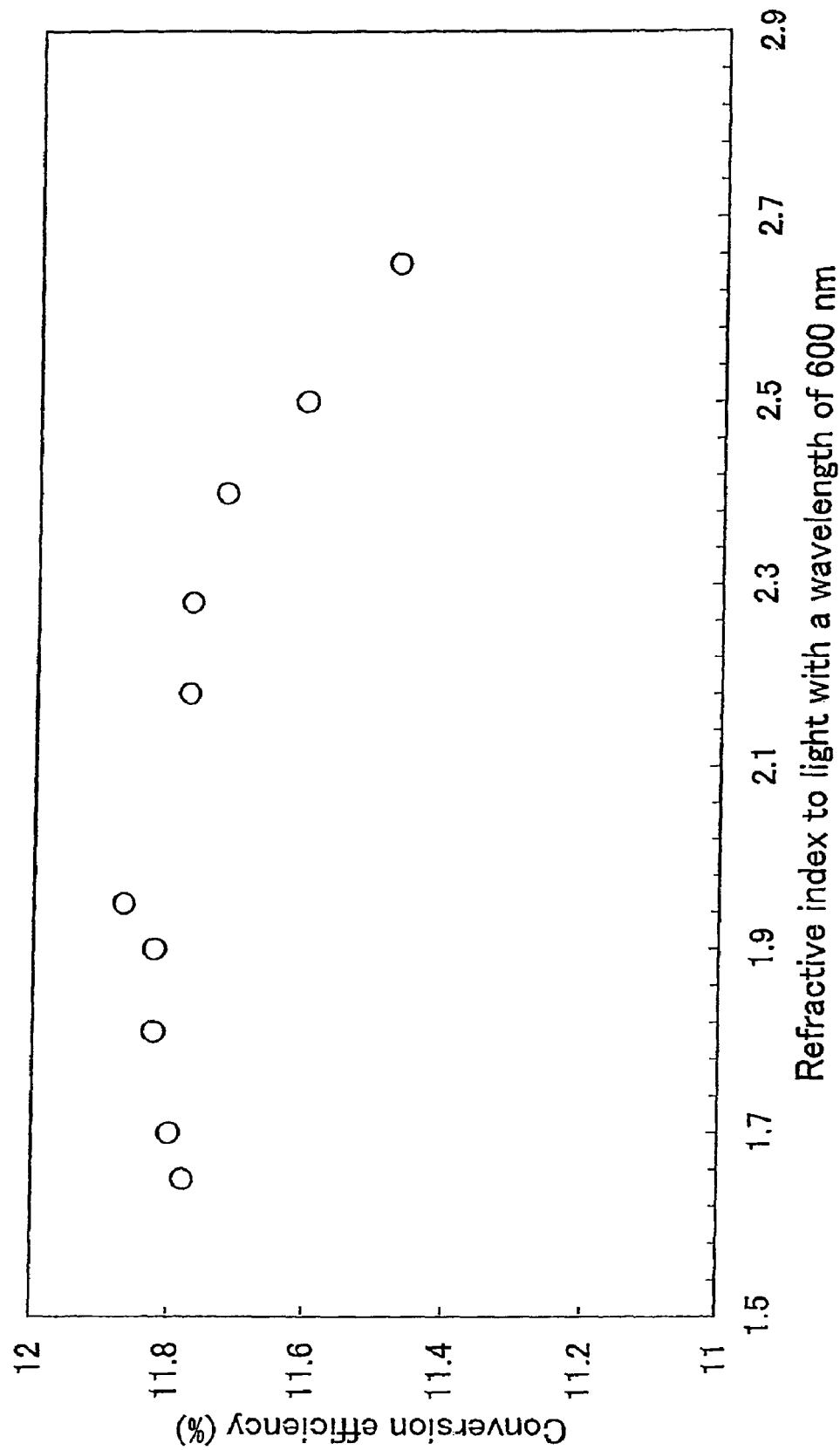
FIG. 5 is a figure showing a relationship between a refractive index of a silicon based low refractive index layer, and conversion efficiency of a hybrid thin film solar cell.

In Example 2, an almost similar process as in Example 1 was carried out except for having varied a refractive index at a wavelength of 600 nm in a range of 1.65 to 2.65 by varying only film-forming conditions of an n type silicon based low refractive index layer 4on. FIG. 5 shows a relationship between refractive indexes of the silicon based low refractive index layer, and conversion efficiency of the hybrid thin film solar cell.

Example 3

Figure 6:
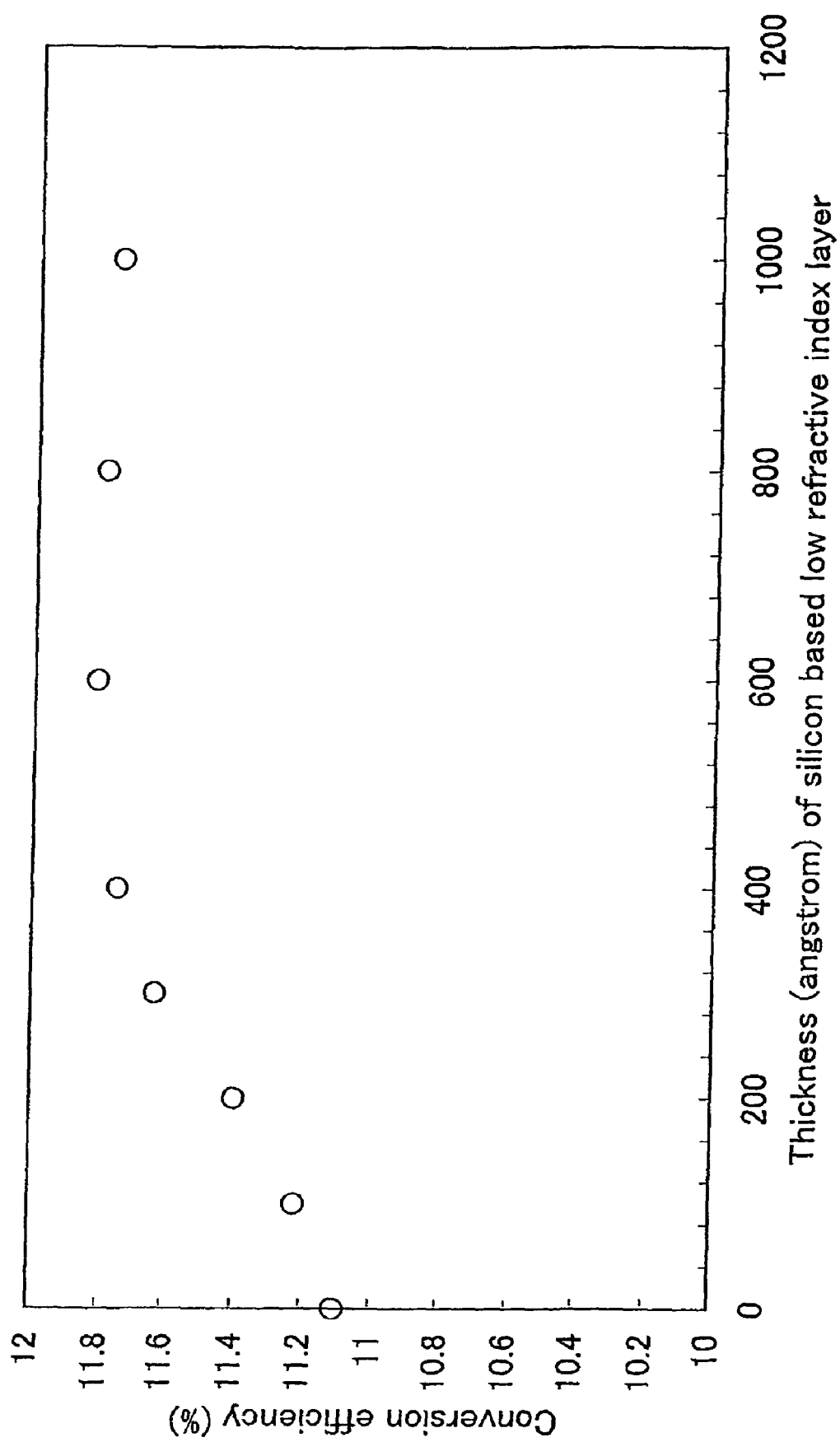
FIG. 6 is a figure showing a relationship between a thickness of silicon based low refractive index layer, and conversion efficiency of a hybrid thin film solar cell.
Figure 7:
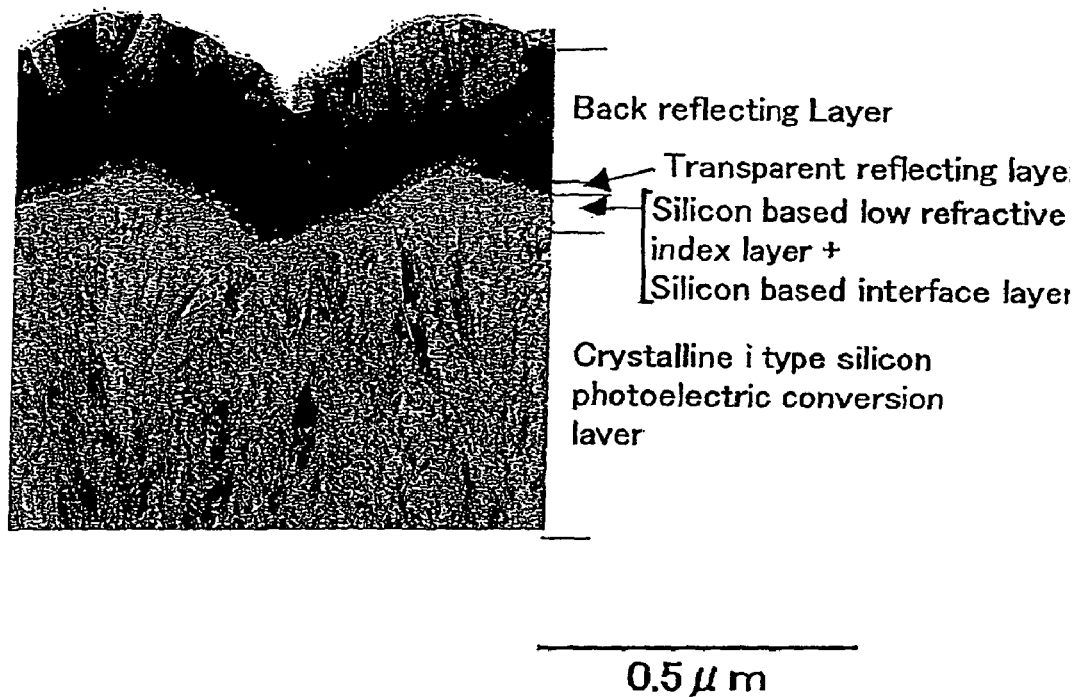
FIG. 7 is an expanded sectional view by transmission electron microscope (TEM) photograph of a silicon based thin film solar cell of the present invention obtained in Example 1.

In Example 3, an almost similar process as in Example 1 was carried out except for having varied a thickness of an n type silicon based low refractive index layer 4on in a range of 100 angstroms to 1000 angstroms. FIG. 6 shows a relationship between a thickness of the silicon based low refractive index layer and obtained conversion efficiency of the hybrid thin film solar cell.

Comparative Example 1

In Comparative Example 1, only following points differed from in Example 1. Instead of laminating sequentially an n type silicon based low refractive index layer 4on and an n type crystalline silicon based interface layer 4n, an n type crystalline silicon layer with a thickness of 150 angstroms and a ZnO layer with a thickness of 600 angstroms were laminated sequentially. Film-forming of ZnO layer was performed by a DC sputtering method. A ZnO layer deposited with a thickness of 2500 angstroms on a glass under an identical film-forming condition was measured for a refractive index by spectrum ellipsometry to give 1.9 at a wavelength of 600 nm. Table 1 shows an average performance of 25 hybrid thin film solar cells produced in Comparative Example 1. A part of the solar cells produced in Comparative Example 1 was dipped in a nitric acid aqueous solution, and etching removal of the back electrode 5 was carried out to expose the n type silicon based interface layer 4n. Light was irradiated from the n type crystalline silicon layer side in this state to obtain a reflection spectrum. FIG. 4 shows the reflection spectrum.

Comparative Example 2

In Comparative Example 2, a similar process as in Example 1 was carried out except for a point of having omitted formation of an n type silicon based interface layer 4n on an n type silicon based low refractive index layer 4on. Table 1 shows an average performance of 25 integrated hybrid thin film solar cells produced in Comparative Example 2.

Comparison between Example 1 and Comparative Example 1 shows that in Example 1 a short-circuit current is improved not less than 4% as compared to that in Comparative Example 1. The reason is shown below. In Example 1, a great portion of a light reaching on a backside of the crystalline i type silicon photoelectric conversion layer 4i was reflected into a side of the crystalline i type silicon photoelectric conversion layer 4i, at an interface between the crystalline i type silicon photoelectric conversion layer 4i and the n type silicon based low refractive index layer 4on, and consequently a percentage of light passing through the n type crystalline silicon based interface layer 4n having a large light absorption loss decreased. On the other hand, in Comparative Example 1, the n type crystalline silicon layer and the ZnO layer are sequentially laminated on a backside of the crystalline i type silicon photoelectric conversion layer 4i, and therefore, a percentage of light passing through the n type crystalline silicon layer having a large light absorption loss increased. And furthermore, in Example 1, damage given to a ground crystalline silicon layer at the time of sputtering of ZnO layer possibly formed in the process of Comparative Example 1 was prevented.

Next, comparison between Example 1 and Comparative Example 2 shows that a fill factor in Example 1 is improved about 5% as compared to that in Comparative Example 2. This is based on a reason that in Example 1, disposition by insertion of the n type crystalline silicon based interface layer 4n between the n type silicon based low refractive index layer 4on and the transparent reflecting layer 5t improves a series resistance of the solar cell.

A test result of a reflection spectrum obtained by measuring with irradiated light from a light incident side and an opposite direction at the time of solar cell characteristics measurement shown in FIG. 4 shows that etching removal of the back electrode 5 enables detection of whether a silicon based low refractive index layer 4on having a smaller refrac-

TABLE 1

|  | Configuration of a crystalline photoelectric conversion unit (only shown layers above p type crystalline Si layer) | Average solar cell performance ||||
|---|---|---|---|---|---|
|  |  | Open circuit voltage (V) (V) | Short-circuit current (mA) (mA) | Curvilinear factor | Conversion efficiency (%) |
| Example 1 | i type crystalline Si layer/n type silicon based low refractive index layer/n type silicon based interface layer/ZnO layer | 1.375 | 11.86 | 0.725 | 11.82 |
| Comparative Example 1 | i type crystalline Si layer/n type silicon layer/ZnO layer | 1.374 | 11.39 | 0.739 | 11.57 |
| Comparative Example 2 | i type crystalline Si layer/n type silicon based low refractive index layer/ZnO layer | 1.378 | 11.74 | 0.696 | 11.26 | tive index is disposed on a backside of a crystalline i type silicon photoelectric conversion layer 4*i*. Results of Example 2 in FIG. 5 shows that a refractive index of the silicon based low refractive index layer has an optimal value, which is preferably not more than 2.5.

Figure 1:
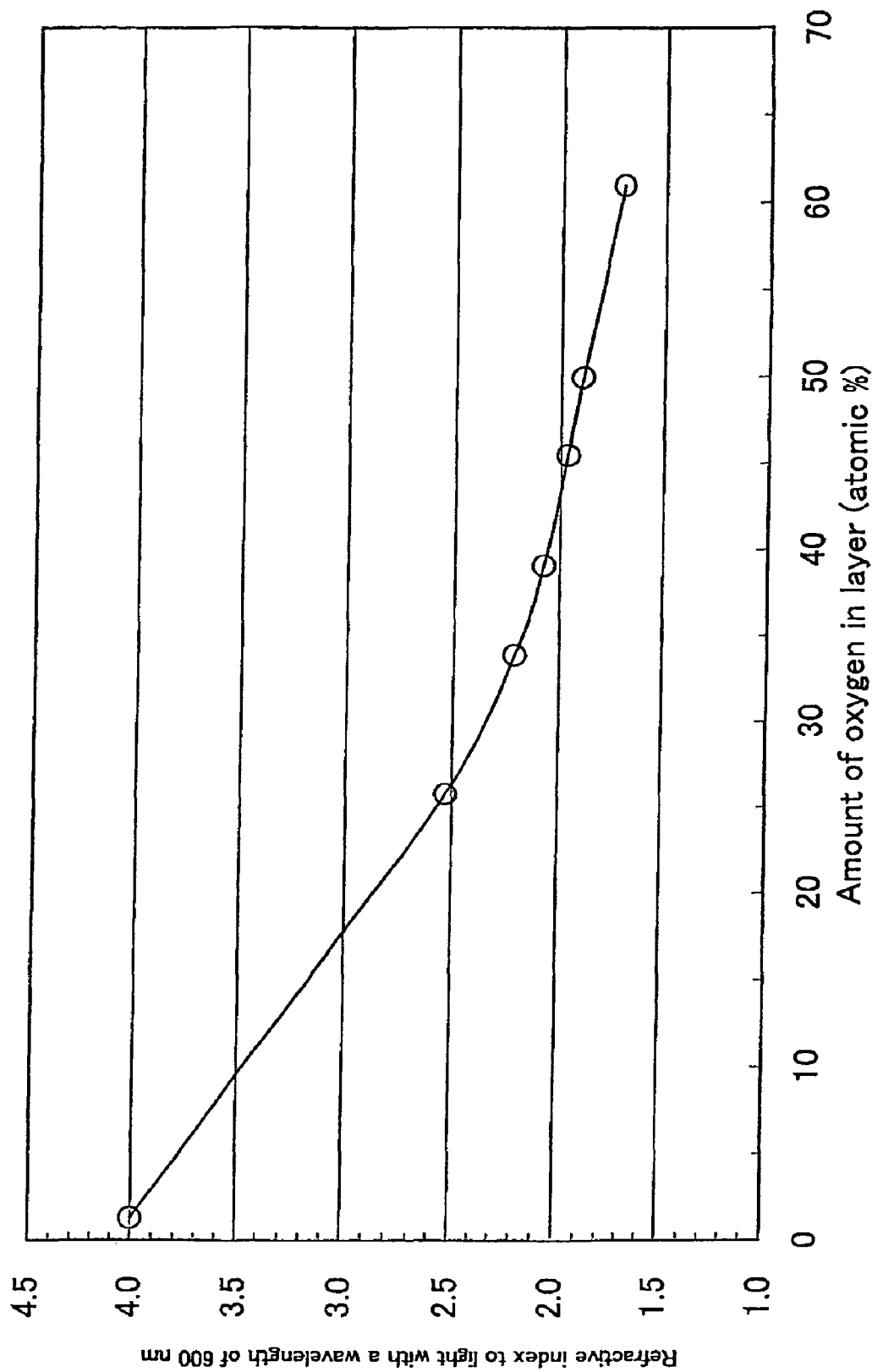
FIG. 1 is a figure showing a relationship of an amount of oxygen in a layer and a refractive index of silicon based low refractive index layer.
Figure 2:
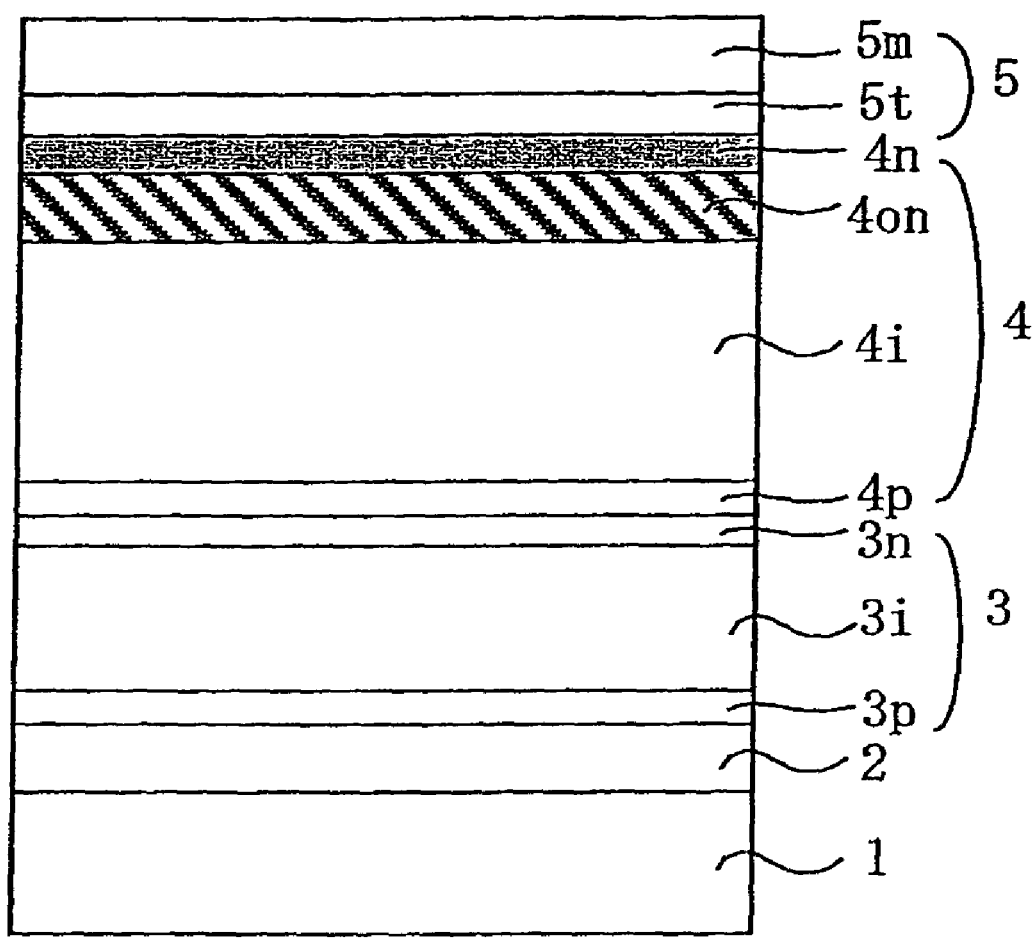
FIG. 2 is a schematic sectional view of a thin film solar cell comprising a silicon based low refractive index layer by the present invention.

FIG. 1 shows that this condition corresponds to a value of not less than 25 atomic % of an amount of oxygen in the layer. This is based on a reason that a refractive index exceeding 2.5 makes a refractive index difference with an adjoining crystalline i type silicon photoelectric conversion layer smaller, which reduces light trapping effect. Results of Example 3 shown in FIG. 6 shows that a thickness of the silicon based low refractive index layer has an optimal value, which is preferably not less than 300 angstroms.

According to the present invention from the above description, sufficient light trapping effect at low cost can be exhibited by disposing a layer having a lower refractive index compared to that of a photoelectric conversion layer, on a backside of the photoelectric conversion layer observed from a light incident side, without using different facilities from those for formation of the photoelectric conversion layer. Furthermore, by disposing a thin silicon based interface layer on a backside of a silicon based low refractive index layer, a series resistance of a solar cell can be kept small. As a result, a silicon based thin film solar cell can be provided efficiently and at low cost.

INDUSTRIAL APPLICABILITY

According to the present invention, sufficient light trapping effect at low cost can be exhibited by disposing a layer having a lower refractive index compared with that of a photoelectric conversion layer, on a backside of the photoelectric conversion layer observed from a light incident side, without using different facilities from those for formation of the photoelectric conversion layer. Furthermore, by disposing a thin silicon based interface layer on a backside of a silicon based low refractive index layer, a series resistance of a solar cell can be kept small. As a result, a silicon based thin film solar cell can be provided efficiently and at low cost.

The invention claimed is:

1. A silicon based thin film solar cell, wherein a conductive type silicon based low refractive index layer, a silicon based interface layer, and a back electrode are disposed and contact one another in this order on a backside of a photoelectric conversion layer observed from a light incident side, wherein the silicon based interface layer comprises a crystalline silicon component in the layer, wherein the silicon based low refractive index layer comprises a crystalline silicon component in the layer, wherein a most abundantly existing constituent element, excluding silicon, in the silicon based low refractive index layer is oxygen, which is present in an amount not less than 25 atomic %, and wherein the silicon based low refractive index layer has a thickness of not less than 300 angstroms.

2. The silicon based thin film solar cell according to claim 1, wherein the silicon based low refractive index layer has a refractive index not more than 2.5 at a wavelength of 600 nm.

3. The silicon based thin film solar cell according to claim 1, wherein the silicon based interface layer has a thickness not more than 150 angstroms.

4. The silicon based thin film solar cell according to claim 1, wherein the silicon based low refractive index layer and silicon based interface layer includes the same conductivity type.

* * * * *